United States Patent
Northrup

(10) Patent No.: US 11,125,731 B2
(45) Date of Patent: Sep. 21, 2021

(54) DETECTION OF A SUSPECT COUNTERFEIT PART BY CHROMATOGRAPHY

(71) Applicant: IEC Electronics Corp., Newark, NY (US)

(72) Inventor: Mark Northrup, Rochester, NY (US)

(73) Assignee: IEC Electronics Corp., Newark, NY (US)

( * ) Notice: Subject to any disclaimer, the term of this patent is extended or adjusted under 35 U.S.C. 154(b) by 0 days.

(21) Appl. No.: 15/882,473

(22) Filed: Jan. 29, 2018

(65) Prior Publication Data

US 2018/0356374 A1    Dec. 13, 2018

Related U.S. Application Data

(60) Provisional application No. 62/518,874, filed on Jun. 13, 2017.

(51) Int. Cl.
| | |
|---|---|
| *G01R 31/28* | (2006.01) |
| *H01L 23/00* | (2006.01) |
| *G01N 30/88* | (2006.01) |
| *G01N 30/86* | (2006.01) |
| *B01D 15/36* | (2006.01) |

(Continued)

(52) U.S. Cl.
CPC ............ *G01N 30/56* (2013.01); *B01D 15/36* (2013.01); *G01N 30/06* (2013.01); *G01N 30/8675* (2013.01); *G01N 30/8686* (2013.01); *G01N 30/88* (2013.01); *G01R 31/2896* (2013.01); *H01L 23/57* (2013.01); *H01L 24/01* (2013.01); *G01N 30/96* (2013.01);

(Continued)

(58) Field of Classification Search
CPC ........ G01N 30/04; G01N 30/06; G01N 30/62; G01N 30/86; G01N 30/8651; G01N 30/8675; G01N 30/8679; G01N 30/8686; G01N 30/88; G01N 30/8804; G01N 2030/062; G01N 2030/042; G01N 2030/045; G01N 2030/047; G01N 2030/8809; G01N 2030/8859; G01N 2030/8868; B01D 15/12; B01D 15/10; G01R 31/2896; H01L 23/57; H01L 24/01
See application file for complete search history.

(56) References Cited

U.S. PATENT DOCUMENTS

| | | | | |
|---|---|---|---|---|
| 4,281,066 | A | * | 7/1981 | Thran .................... C12M 33/04 435/30 |
| 5,554,537 | A | * | 9/1996 | Sharpe .................... G01N 1/02 435/30 |

(Continued)

OTHER PUBLICATIONS

Deconinck et al. Chromatography in the detection and characterization of illegal pharmaceutical preparations. J Chromatogr. Sci. (Sep. 2013); 51(8): p. 791-806. (Year: 2013).*

(Continued)

*Primary Examiner* — Katherine Zalasky McDonald
(74) *Attorney, Agent, or Firm* — Harter Secrest & Emery LLP; Brian B. Shaw, Esq.; Timothy W. Menasco, Esq.

(57) ABSTRACT

Parts are exposed to liquid chromatography to generate a corresponding chromatogram, wherein the chromatogram is compared to a chromatogram of a genuine part to determine if the tested part is suspect counterfeit. Depending on the selected predetermined target analytes, the generated chromatogram can be used to assess an associated manufacturing process as conforming or non-conforming.

20 Claims, 9 Drawing Sheets

(51) Int. Cl.
*G01N 30/06* (2006.01)
*G01N 30/96* (2006.01)
*G01N 30/04* (2006.01)
*G01N 30/56* (2006.01)

(52) U.S. Cl.
CPC . *G01N 2030/042* (2013.01); *G01N 2030/062* (2013.01); *G01N 2030/8859* (2013.01); *G01N 2030/8886* (2013.01); *H01L 2924/14* (2013.01)

(56) References Cited

U.S. PATENT DOCUMENTS

| | | | | |
|---|---|---|---|---|
| 6,881,554 | B2 * | 4/2005 | DiCesare | B01L 3/5029 |
| | | | | 422/404 |
| 6,898,991 | B2 * | 5/2005 | Geise | G01N 1/02 |
| | | | | 73/864.52 |
| 8,677,840 | B2 * | 3/2014 | Page | G01N 1/02 |
| | | | | 73/863 |

OTHER PUBLICATIONS

Guin et al. Counterfeit integrated circuits: Detection, avoidance, and the challenges ahead. J. Electron. Test. (Feb. 2014) p. 1-15. (Year: 2014).*

IPC. IPC-TM-650 Test Methods Manual. No. 2.3.28 (Nov. 2012) pp. 1-3. (Year: 2012).*

Van Berkel et al. Established and emerging atmospheric pressure surface sampling/ionization techniques for mass spectrometry. J. Mass. Spectrom. 2008; 43: 1161-1180. (Year: 2008).*

* cited by examiner

FIGURE 1
FIGURE 2
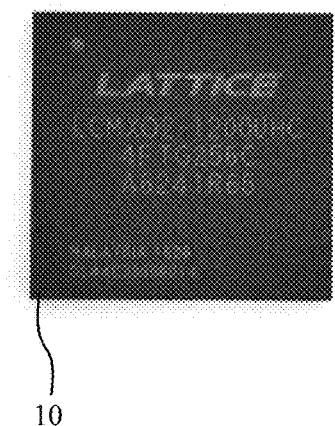
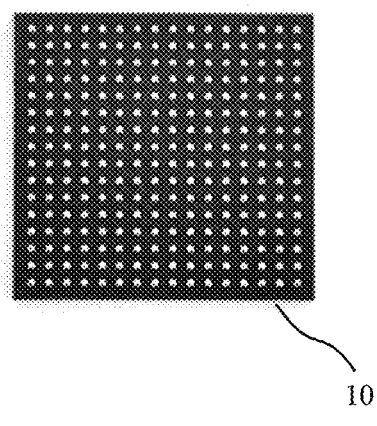
FIGURE 3
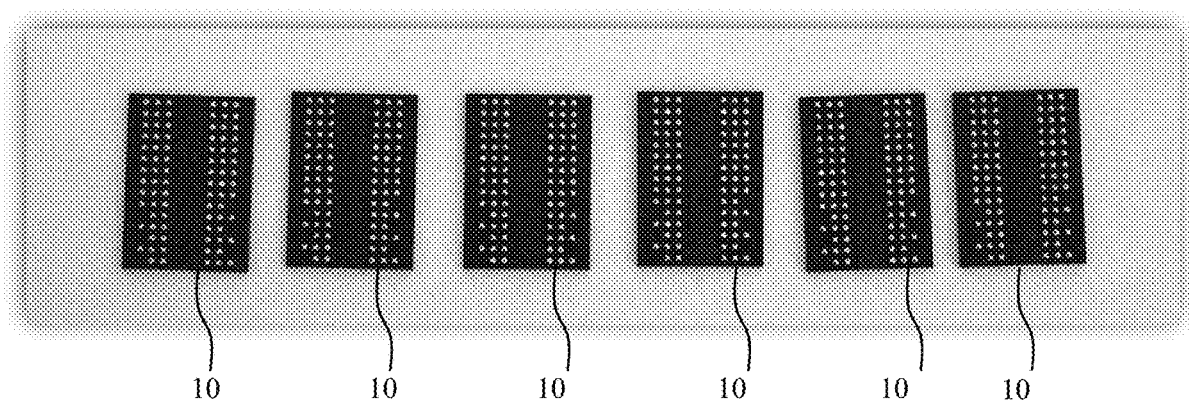

F, Cl, Br, PO$_4$ and SO$_4$

90

Sample

Formate, NO$_2$, NO$_3$, Succinate and Maleate

FIGURE 12

| Ion Name | Chemical ID | (Sample Group #1) | | | | |
|---|---|---|---|---|---|---|
| | | 1001-001-01 | 1001-001-02 | 1001-001-03 | Mean | Mean / Part |
| Lithium | $Li^+$ | 0.00 | 0.00 | 0.00 | 0.00 | 0.000 |
| Sodium | $Na^+$ | 0.02 | 0.02 | 0.03 | 0.02 | 0.004 |
| Ammonium | $NH_4^+$ | 0.07 | 0.07 | 0.06 | 0.07 | 0.011 |
| Potassium | $K^+$ | 0.02 | 0.01 | 0.00 | 0.01 | 0.002 |
| Magnesium | $Mg^{2+}$ | 0.05 | 0.06 | 0.05 | 0.05 | 0.009 |
| Calcium | $Ca^{2+}$ | 0.00 | 0.00 | 0.00 | 0.00 | 0.000 |
| Fluoride | $F^-$ | 0.00 | 0.00 | 0.00 | 0.00 | 0.000 |
| Chloride | $Cl^-$ | 0.01 | 0.01 | 0.02 | 0.01 | 0.002 |
| Nitrite | $NO_2^-$ | 0.00 | 0.00 | 0.00 | 0.00 | 0.000 |
| Bromide | $Br^-$ | 0.00 | 0.00 | 0.00 | 0.00 | 0.000 |
| Nitrate | $NO_3^-$ | 0.00 | 0.00 | 0.00 | 0.00 | 0.000 |
| Phosphate | $PO_4^{3-}$ | 0.00 | 0.00 | 0.00 | 0.00 | 0.000 |
| Sulfate | $SO_4^{2-}$ | 0.00 | 0.00 | 0.00 | 0.00 | 0.000 |
| Acetate | $C_2H_3O_2^-$ | 0.00 | 0.00 | 0.00 | 0.00 | 0.000 |
| Formate | $CHO_2^-$ | 0.12 | 0.12 | 0.14 | 0.13 | 0.021 |
| Succinate | $C_4H_4O_4^{2-}$ | 0.00 | 0.00 | 0.00 | 0.00 | 0.000 |
| Adipate | $C_6H_8O_4^{2-}$ | 0.00 | 0.00 | 0.00 | 0.00 | 0.000 |
| Maleate | $C_4H_2O_4^{2-}$ | 0.00 | 0.00 | 0.00 | 0.00 | 0.000 |
| Citrate | $C_6H_5O_7^{3-}$ | 0.00 | 0.00 | 0.00 | 0.00 | 0.000 |

90

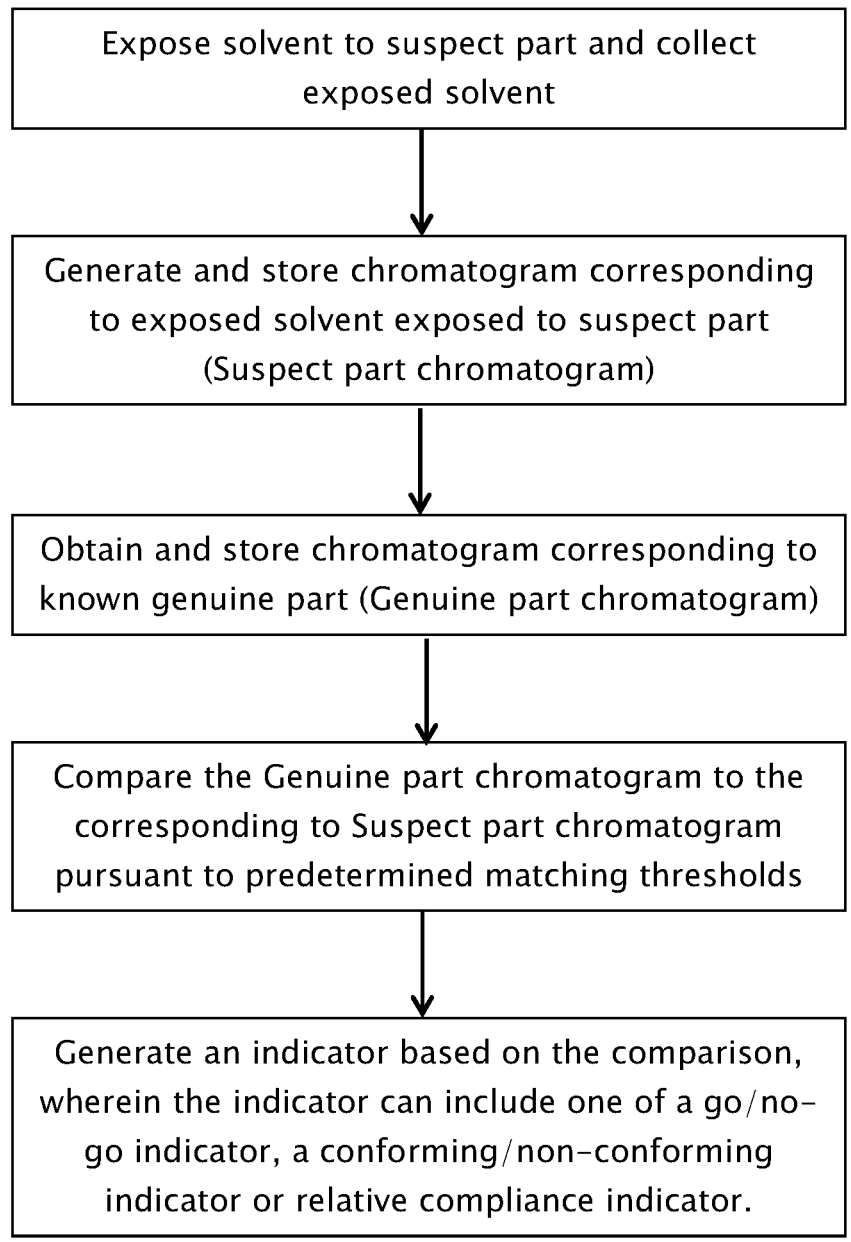

DETECTION OF A SUSPECT COUNTERFEIT PART BY CHROMATOGRAPHY

STATEMENT REGARDING FEDERALLY SPONSORED RESEARCH OR DEVELOPMENT

Not applicable.

REFERENCE TO A "SEQUENCE LISTING"

Not applicable.

BACKGROUND OF THE INVENTION

Field of the Invention

The present disclosure relates generally to the detection by chromatography of a suspect counterfeit part or a deviation in a manufacturing process and more particularly to detection of such part or deviation of such process by liquid chromatography.

Description of Related Art

Electronic equipment typically includes at least one integrated circuit. Integrated circuits include an internal circuit typically formed on a semiconductor substrate, the "die", which is packaged within an integrated circuit package. Package types include metal packages with metal covers, ceramic packages, and plastic packages. The package also provides support for electrical leads or pads which allow an end user of the integrated circuit to make electrical connections to the circuit on the die mounted within the package.

Counterfeiting of electronic components, including integrated circuits can be quite profitable and has thus become a significant problem. In counterfeit package marking, the counterfeiter merely replaces the package label to reflect a higher grade or more costly component, or to cause another type of integrated circuit to "look like" a more expensive or more sought after integrated circuit based solely on the marking. In a further counterfeiting scheme, the counterfeiter copies a die design starting with a raw substrate, thus foundries are manufacturing entire counterfeit products.

In another type of counterfeiting, there is unauthorized packaging of an otherwise genuine die (e.g. from old stock that was never packaged) using un-authorized assembly processes. Even though the die is genuine, since the assembly practice and materials may not conform to the original standards, the packaged device is counterfeit.

Counterfeit integrated circuits can cause havoc in the electronics industry. Assembled electronic equipment having counterfeit integrated circuits might not perform as designed. An electronic assembly unknowingly built with counterfeit integrated circuits might not meet its designed operational performance, or it might fail entirely. Perhaps a worst case scenario is where the equipment appears to perform properly, but causes some unexpected operation because counterfeit integrated circuit has some subtle design/performance difference from the genuine component. For an example, an aircraft control system including a flight computer with a counterfeit integrated circuit might respond to some stimulus in an erratic or unintended way.

A further complication is associated with legacy systems that need genuine replacement integrated circuits. The replacement circuits can be newly produced integrated circuits using the prior older proven designs or can be completely new replacement circuits. The problem is that none of the current anti-counterfeiting techniques address the counterfeiting problem for legacy and obsolete integrated circuits, many of which are still crucial components in high reliability applications such as military electronics applications.

The increasingly complex global semiconductor supply chain, spanning different countries provides ample opportunities for counterfeit integrated circuits to enter the market. Prior to actual deployment, an IC is often bought and resold many times. Purchasers rely on brokers, who in turn may buy from untrustworthy entities including online forums.

Therefore, a need exists for the identification of suspect counterfeit parts including integrated circuits, wherein the testing can be readily conducted to identify suspect parts as well as issues with a manufacturing or assembly process.

BRIEF SUMMARY OF THE INVENTION

In one configuration, the present disclosure provides a method including exposing a suspect part to a solvent, the solvent configured to dissolve at least one predetermined target analyte; obtaining a first chromatogram corresponding to the at least one predetermined analyte dissolved in the solvent exposed to the suspect part; and comparing the first chromatogram to a preexisting chromatogram corresponding to at least one of a known genuine part and a conforming process.

In a further configuration, a method is provided by which a counterfeit part or non-conforming process can be identified connecting a part and a board to form an assembly; contacting a solvent with at least a portion of the assembly, the solvent configured to dissolve a predetermined target analyte; generating a first chromatogram corresponding to the predetermined target analyte carried by the solvent contacting the assembly; and associating an assessment value to the assembly, the assessment value corresponding to the first chromatogram.

Also disclosed is an apparatus for assessing a suspect part, the apparatus including a reservoir retaining a volume of a solvent; a liquid interface selectively contacting at least a portion of the suspect part with the solvent to form a mixture; a stationary phase for receiving the mixture; a detector for detecting one of a predetermined component of the mixture and generating a corresponding signal; a memory storing at least one genuine part chromatogram; a controller connected to the detector and the memory, the controller configured to generate a chromatogram corresponding to the signal from the detector and compare the generated chromatogram to the genuine part chromatogram and assess the suspect part.

BRIEF DESCRIPTION OF THE SEVERAL VIEWS OF THE DRAWING(S)

FIG. 1 is a top plan view of a part, such as a suspect part, to be tested.

FIG. 2 is a bottom plan view of the part of FIG. 1.

FIG. 3 is a bottom plan view of a plurality of parts, such as a suspect parts, that can be tested simultaneously.

FIG. 12 is chromatogram showing nineteen predetermined analytes for a set of tested parts.

FIG. 13 is a representative flow chart of a method for providing a go/no-go indicator with respect to a suspect part or a process.

DETAILED DESCRIPTION OF THE INVENTION

Figure 4:
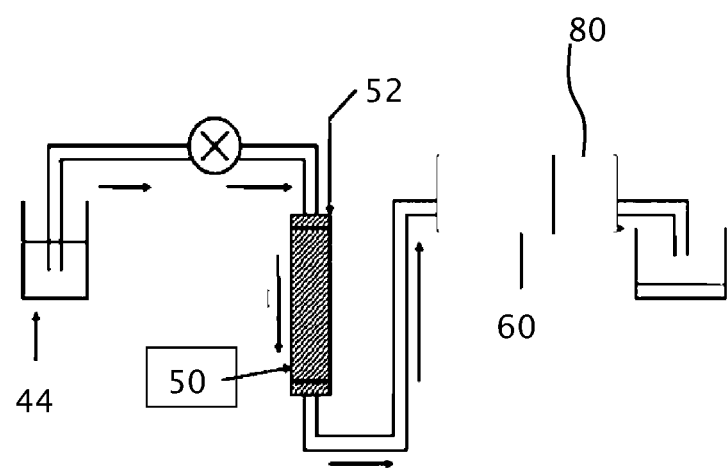
FIG. 4 is a schematic view of a representative system for liquid chromatography.
Figure 5:
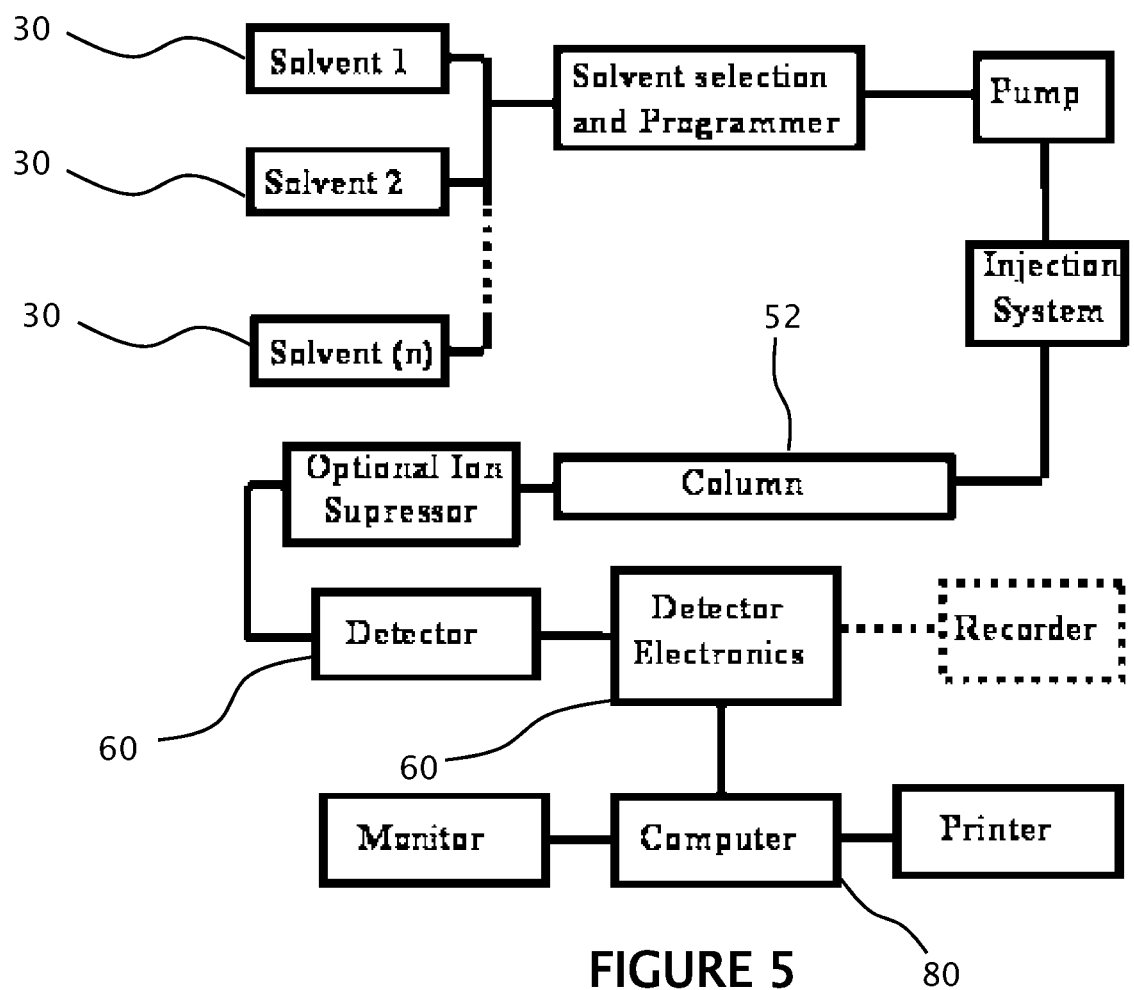
FIG. 5 is a schematic view of a representative system for ion chromatography.

The present system and method provides for the identification of suspect counterfeit parts as well as deviations or variations in a manufacturing processes (that is a conforming or non-conforming manufacturing process), wherein the tested manufacturing process can be either an internal process or the process of a third party, such that the testing is conducted in real time during or after completion of the manufacturing process.

Generally, chromatography is used to identify predetermined target analytes associated with either genuine parts or counterfeit parts or with a conforming or a non-conforming manufacturing process. In one configuration, ion chromatography is used to identify the presence and/or amount of a target analyte associated with the part, wherein the presence or absence of the target analyte or the relative quantity of the target analyte can be used to assess whether the part is counterfeit or genuine. Similarly, ion chromatography is used to identify the presence and/or amount of a target analyte associated with a conforming or non-conforming manufacturing process, wherein the presence or absence of the target analyte or the relative quantity of the target analyte can be used to assess whether the manufacturing process is conforming or non-conforming.

For purposes of the present description, the term "part" 10 means any previously formed element, board, connector, or electronic component. As seen in FIGS. 1-3, part includes integrated circuits and associated leads. The term "assembly" means any combination of parts and thus includes at least one part 10.

For purposes of the present description, the term "electronic component" means any basic discrete device or physical entity in an electronic system used to affect electrons or their associated fields. The electronic component may have a number of electrical terminals or leads.

For purposes of the present description, the term "liquid interface" means the area of exposure of the solvent to a given part. The liquid interface can include a reservoir retaining a volume of solvent which is exposed to the part as well as restricted or localized interfaces which present a volume of the solvent to a localized portion of the part.

For purposes of the present description, the term "board", sometimes referred to as a printed circuit board or pcb, means a structure that mechanically supports and electrically connects electronic components using conductive tracks, pads and other features etched from copper sheets laminated onto a non-conductive substrate. Electronic component (e.g. capacitors, resistors or active devices) are generally soldered on the board. Advanced boards may contain components embedded in a substrate of the board. The boards can be single sided (one copper layer), double sided (two copper layers) or multi-layer (outer and inner layers). Conductors on different layers are typically connected with vias. Boards can be single layer or multi-layer depending on the intended configuration of the assembly.

For purposes of the present description, the term "chromatogram" means a record of a chromatographic separation, wherein the record can be in tabular, numeric, symbolic, graphic or text form.

For purposes of the present description, the term "solvent" means any fluid which dissolves ions, predetermined analytes, from the part or a process. The solvent can include liquids and gases, including but not limited to ethyl acetate, acetone, cyclohexane, n-Pentane, toluene, 1-methyl-2-pyrolidone, 1,4-Dioxane, acetonitrile, 1,2-Dichloroethane, n-hexane as well as water.

For purposes of the present description, the term "analyte" means a substance whose chemical constituents are being identified and select properties of the analyte or properties influenced by a concentration of analyte may be measured. Predetermined analytes include, but are not limited to:

| Ion Name | Chemical ID |
|---|---|
| Lithium | $Li^+$ |
| Sodium | $Na^+$ |
| Ammonium | $NH_4^+$ |
| Potassium | $K^+$ |
| Magnesium | $Mg^{2+}$ |
| Calcium | $Ca^{2+}$ |
| Fluoride | $F^-$ |
| Chloride | $Cl^-$ |
| Nitrite | $NO_2^-$ |
| Bromide | $Br^-$ |
| Nitrate | $NO_3^-$ |
| Phosphate | $PO_4^{3-}$ |
| Sulfate | $SO_4^{2-}$ |
| Acetate | $C_2H_3O_2^-$ |
| Formate | $CHO_2^-$ |
| Succinate | $C_4H_4O_4^{2-}$ |
| Adipate | $C_6H_8O_4^{2-}$ |
| Maleate | $C_4H_2O_4^{2-}$ |
| Citrate | $C_6H_5O_7^{3-}$ |

For purposes of the present description, the term "counterfeit" means an unlawful or unauthorized reproduction, substitution, or alteration that has been mismarked, misidentified, or otherwise misrepresented to be an authentic, unmodified part or conforming process of the original manufacturer, or a source with the express written authority of the original manufacturer or current design activity, including an authorized aftermarket manufacturer. Unlawful or unauthorized substitution includes used parts represented as new, or the false identification of grade, serial number, lot number, date code, or performance characteristics. A counterfeit part includes an unauthorized copy or substitute part that has been identified, marked, and/or altered by a source other than the part's legally authorized source and has been misrepresented to be from a legally authorized source; a part misrepresented to be an authorized item of the legally authorized source as well as a new, used, outdated, or expired part from a legally authorized source that is misrepresented by any source to the end-user as meeting the performance requirements for the intended use.

For purposes of the present description, the term "suspect counterfeit part" means a part for which credible evidence (including, but not limited to, testing or visual inspection) provides reasonable doubt that the part is authentic/genuine.

For purposes of the present description, the term "manufacturing process" means the process of converting raw materials or parts into finished goods or subassemblies that are subsequently incorporated in to a finished good that is intended to meet the expectations or specifications of a customer or end user.

As manufacturing tolerances further decrease and miniaturization is further sought, both anion and cation contaminates can be a material consideration in the manufacturing process or the performance of a part or assembly. For example, anion (net negative charge) contaminates include, but are not limited to $F^-$, $Cl^-$, $NO_2^-$, $NO_3^-$, $PO_4^{3-}$ and $SO_4^{2-}$. Cation (net positive charge) contaminates include, but are not limited to $Li^+$, $Na^+$, $K^+$, $NH_4^+$, $Mg^{2+}$ and $Ca^{2+}$.

With respect the manufacturing processes involving parts and the assembly of parts, there may be material ionic contaminates encountered during or because of the manufacturing process. Sources of contamination from organic compounds in process chemistries include plating baths and hot air solder leveling (HASL) flux chemistries for printed boards. Flux used for reballing, lead tinning and assembly can yield organic acid residues depending on flux composition as well as acetate, adipate, formate, maleate and succinate for example. There residual materials can adversely impact the performance of the resulting part or assembly. Thus, depending upon the process being conforming or non-conforming with respect to an approved process, there can be analytes present or absent corresponding to the status of the process.

By selecting a given predetermined analyte or set of predetermined analytes, a corresponding chromatogram can be generated. The selection of the predetermined analyte(s) can correspond to whether a part, an assembly, or a process is being tested. In one configuration, the target analyte includes at least one target anion and one target cation. In a further configuration, the target analyte includes at least three target anions and three target cations.

It is advantageous, if the predetermined target analyte set includes sufficient target analytes to identify at least one of the part, the component, the board or the process as suspect counterfeit or non-conforming.

In one testing, the following predetermined analytes have been used for testing:

| | |
|---|---|
| Lithium | $Li^+$ |
| Sodium | $Na^+$ |
| Ammonium | $NH_4^+$ |
| Potassium | $K^+$ |
| Magnesium | $Mg^{2+}$ |
| Calcium | $Ca^{2+}$ |
| Fluoride | $F^-$ |
| Chloride | $Cl^-$ |
| Nitrite | $NO_2^-$ |
| Bromide | $Br^-$ |
| Nitrate | $NO_3^-$ |
| Phosphate | $PO_4^{3-}$ |
| Sulfate | $SO_4^{2-}$ |
| Acetate | $C_2H_3O_2^-$ |
| Formate | $CHO_2^-$ |
| Succinate | $C_4H_4O_4^{2-}$ |
| Adipate | $C_6H_8O_4^{2-}$ |
| Maleate | $C_4H_2O_4^{2-}$ |
| Citrate | $C_6H_5O_7^{3-}$ |

It is further contemplated that in some configurations, less than all of the above listed anions and cations can be used for the testing. That is, various subsets of the listed anions and cations can be employed. Conversely, it is contemplated additional analytes can be used for testing, depending on the part or process being tested.

Liquid chromatography is a technique used to separate components, such as the target analytes, from within a mixture, with for example the solvent. The separation of the target analytes from the mixture (the target analytes from the solvent) occurs based on the interactions of the target analytes within the mixture with the mobile and stationary phases. A variety of stationary/mobile phase combinations can be employed when separating the target analytes from the mixture, for example several different types of chromatography are classified based on the physical states of those phases. In one configuration, liquid-solid column chromatography, employs a liquid mobile phase which slowly filters down through the solid stationary phase.

In the liquid-solid column chromatography, the components within the mixture are separated in a column based on the affinity of each component affinity for the mobile (such as the solvent) phase. Generally, if the components have different polarities and the mobile phase having a distinct polarity are passed through a column, such as a packed column, one component will migrate through the column faster than the other. Because molecules of the same component will generally move in groups, the compounds are separated into distinct bands within the column. If the components being separated are colored, their corresponding bands can be visually recognized. Alternatively or additionally, the presence of the bands can be detected using other instrumental analysis techniques such as UV-VIS spectroscopy, as in high performance liquid chromatography.

In one configuration, the chromatograph for assessing a suspect counterfeit part 10 is accomplished with a reservoir 20 retaining a volume of a solvent 30; a liquid interface 40 selectively contacting at least a portion of the part 10 with the solvent for a predetermined analyte to form a mixture 32; a stationary phase 50, such as in a packed column 52, for receiving the mixture; a detector 60 for detecting a presence or absence of the predetermined analyte in the mixture and generating a corresponding signal; a memory 70 storing at least one genuine part chromatograph and a controller 80 connected to the detector and the memory, the controller configured to generate a chromatogram 90 corresponding to the signal from the detector and compare the generated chromatogram to the genuine part chromatogram and assess whether the tested part is a suspect counterfeit part. As set forth below, it is contemplated the reservoir 20 may have a variable volume and the controller 80 is configured to generate a go/no-go indicator based on the comparison.

It is contemplated the reservoir 20 can be employed to retain both the solvent 30 and the part 10 for the necessary residence time. In certain configurations, the reservoir 20 is a fixed volume, thereby providing a constant volume of solvent to be exposed to a given part. However, in select configurations, the reservoir 20 defines a variable volume, thereby allowing the amount of solvent 30 used to immerse or soak the part 10 to be minimized, thereby increasing the concentration of the predetermined analyte in the solvent.

Figure 6:
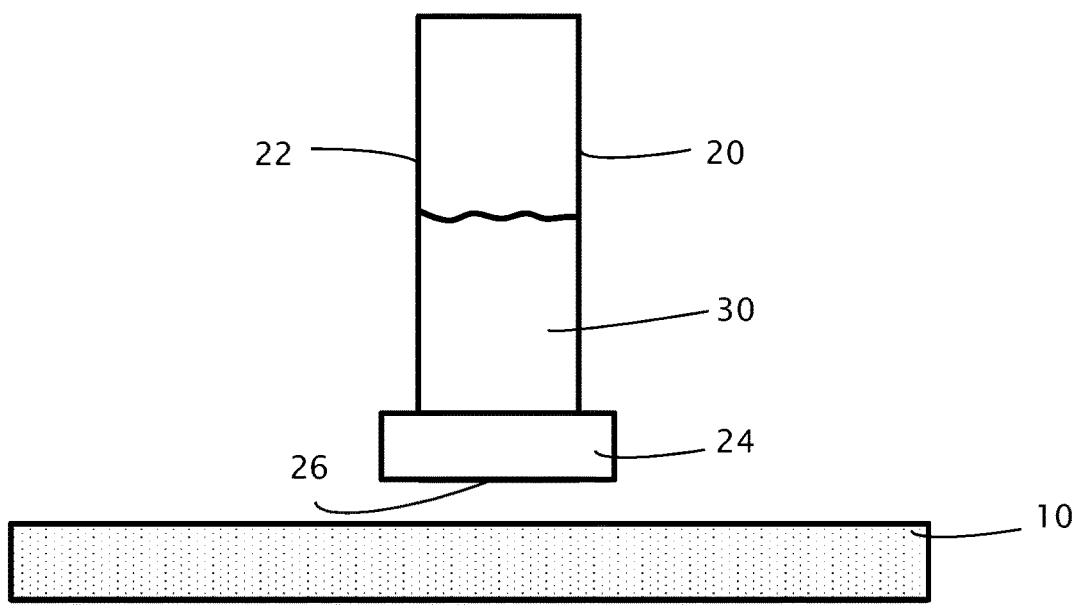
FIG. 6 is a schematic of reservoir and liquid interface for testing a portion of a part.

However, it is understood it may be advantageous or necessary to expose only a portion of the part 10 to the solvent 30. For example, referring to FIG. 6, the reservoir is configured as a tube or sleeve 22 having a sealing interface at one open end to form a reservoir volume partly defined by a portion of the part, wherein the sealing interface is contacted with the abutting portion of the part to define a liquid interface 40. Solvent 30 in the reservoir is then exposed the portion of the part.

The amount of surface area of the part 10 exposed to the solvent 30 is at least partly determined by the configuration of the part. For certain parts 10, at least one square inch is exposed to the solvent 30. However, it is believed as little as hundredths of a square inch of the part 10 can be exposed to the solvent 30 to capture the predetermined analyte. Conversely, depending on the configuration of the part 10 the exposed surface area can be multiple square inches.

Generally, the residence time of the solvent 30 and the part 10 is selected to be sufficient to capture/retain the available predetermined analyte.

The packed column 52 provides the stationary phase 50, wherein the type of adsorbent material used as the stationary phase is selected for effective separation of the predetermined analytes in the mixture. Several different solids, adsorbent materials, can be used in the packed column 52. The adsorbent solid can be chosen based on particle size and activity of the solid. The activity of the adsorbent is represented by an activity grade, which is a measure of the attraction of the adsorbent for the target analytes, solutes, in the mixture. Solids with the highest activity grading are those that are completely anhydrous. Typical adsorbents include silica gel and alumina.

A mobile phase 44, sometimes the solvent 30 or sometimes referred to an eluent, is selected in view of the predetermined analytes to be separated from the mixture. The solvent 30, or eluent, can be chosen based on its polarity relative to the target analytes and the stationary phase 50. With a strong polar adsorbent stationary phase 50 like alumina, a polar solvent as the mobile phase will be adsorbed by the stationary phase, which may displace molecules of the predetermined analytes in the mixture and may cause the predetermined analytes to elute quickly. The fast elution results in minimal separation of the predetermined analytes in the mixture. Thus, it is preferable to start elution with a solvent 30 lower polarity to elute the predetermined analytes that are weakly adsorbed to the stationary phase 50. The eluent may also be changed during separation in order to change the polarity and therefore elute the various predetermined analytes with greater separation.

In a typical first step, the mixture having the predetermined analytes and the solvent 30 is introduced to the top of a wet packed column 52. As the mobile phase 44 passes through the packed column 52, the predetermined analytes begin to separate into bands corresponding to the polarity of the predetermined analytes, the solvent or eluent and the packed column. As each predetermined analytes is eluted from the packed column 52, each predetermined analytes can be collected separately and analyzed by an appropriate characteristic.

The liquid chromatography includes normal phase chromatography, reverse phase chromatography, flash chromatography, partition chromatography, liquid solid chromatography, ion chromatography, size exclusion chromatography, affinity chromatography and chiral chromatography.

For purposes of description, the liquid chromatography is set forth as ion chromatography, though it is understood any type of liquid chromatography compatible with the desired target analytes can be employed.

Ion chromatography separates the target or predetermined analytes, ions and polar molecules based on their affinity to an ion exchanger. For purposes of the present disclosure, ion chromatography includes, at least, anion-exchange and cation-exchange types. The charged molecules bind to moieties which are oppositely charged by forming ionic bonds to the insoluble stationary phase. The equilibrated stationary phase consists of an ionizable functional group, to which the target analytes in the mixture to be separated and quantified can bind while passing through the column. A cationic stationary phase is used to separate anions and an anionic stationary phase is used to separate cations. Cation exchange chromatography is used when the desired molecules to separate are cations and anion exchange chromatography is used to separate anions. The bound molecules then can be eluted and collected using an eluent which contains anions and cations by running higher concentration of ions through the column or changing pH of the column. The eluent is percolated through the stationary phase 50 and competes with the analyte and any matrix components for binding to the ionic moieties. It is understood the term eluent includes any liquid solution or buffer solution that is passed or pumped into the chromatography column 52. During this competition, the target analyte and any matrix component will separate from each other by eluting off of the stationary phase 50 as a function of time and then be subsequently detected at the detector 60. Examples of some typical detectors 60 are a conductivity detector, a UV-VIS spectrophotometer, and a mass spectrometer. However, it is understood that any detector 60 as known in the art can be used to identify and quantify the respective analyte.

The ion chromatography requires only one interaction during the separation as opposed to other separation techniques; therefore, ion chromatography may have higher matrix tolerance. In one configuration, the concentration of a predetermined target analyte is measured by ion chromatography (IC, or "ion-exchange chromatography"). Ion chromatography systems are known in the art and commercially available from, e.g., Dionex Corporation (Sunnyvale, Calif.). Detailed guidance and protocols for detecting and measuring the concentration of analytes of interest by ion chromatography can be found, e.g., in Fritz and Gjerde, "Ion Chromatography", 4th edition, Apr. 14, 2009, and Weiss and Weiss, "Handbook of Ion Chromatography", 3rd edition, Jan. 3, 2005, herein expressly incorporated by reference.

Figure 7:
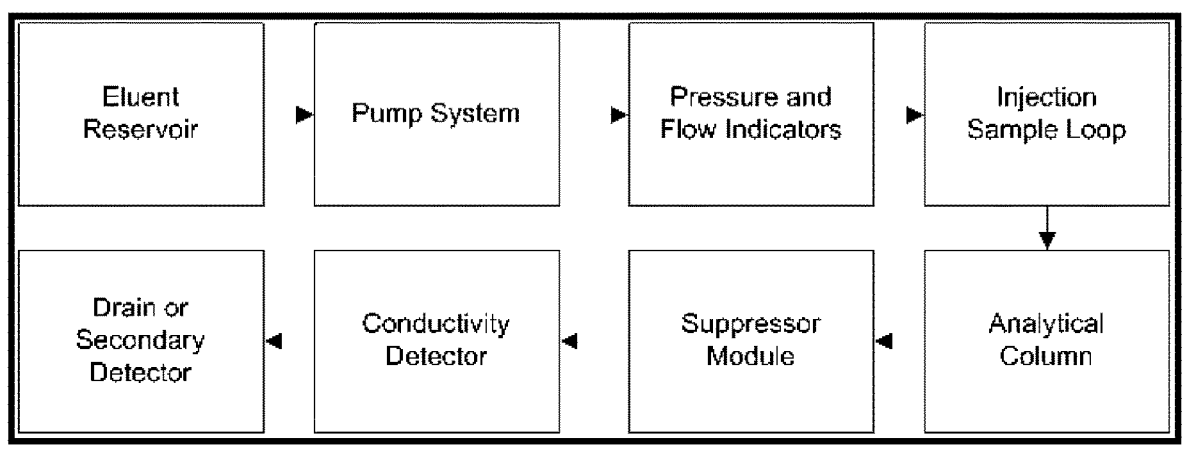
FIG. 7 is a schematic view of a further representative system for ion chromatography.
Figure 8:
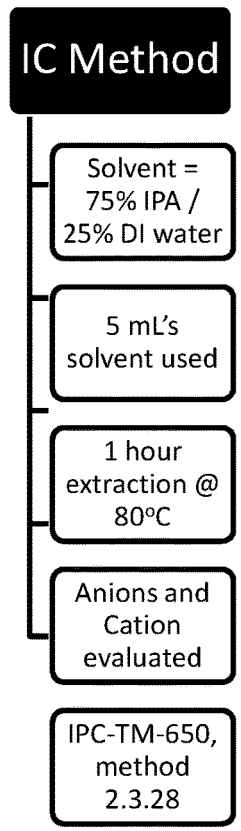
FIG. 8 is a schematic view of a representative method with operating parameters for ion chromatography.
Figure 9:
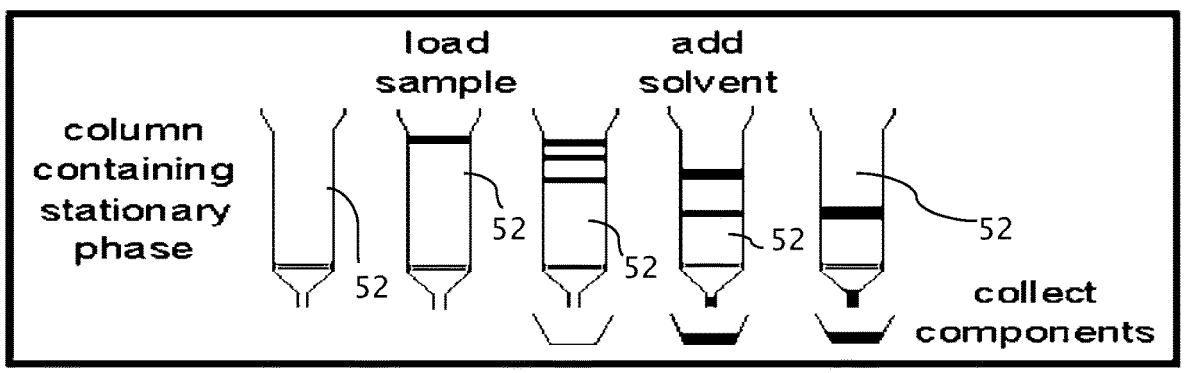
FIG. 9 is an illustrative representation of the separation of predetermined target analytes in liquid chromatography.

Referring to FIGS. 7 and 8, for determining the status of a part 10 or assembly as a suspect counterfeit part (or assembly) or the status of a process as conforming or non-conforming, at least a portion of the part or assembly is exposed to the solvent. Although the steps are set forth in terms of one part 10, it is understood the system and steps are equally applicable to an assembly. It is further understood the testing of a part 10 or an assembly can be used as a surrogate for any associated process, to assess the compliance of the process with protocol.

In certain configurations, the entire part 10 is exposed to the solvent 30, such as immersing, soaking or washing the part with the solvent. While the volume of the solvent 30 exposed to the part 10 can be selected over a variety of volumes, it is believed beneficial to minimize the amount of solvent used, thereby effectively increasing the concentration of the predetermined analyte in the solvent. Thus, in some configurations, the volume of solvent 30 is less than the volume of the part 10. In other configurations, the volume of solvent 30 is equal to the volume of the part 10. In further configurations, the volume of solvent 30 is greater than the volume of the part 10.

In alternative configurations, the volume of the solvent 30 relative to the volume of the part 10 can be adjusted, such that the volume of the part is at least 20% or 40%, or 60%, or 80% or a 100% or at least 120%, or at least 140% or at least 160% of the volume of the solvent.

It is contemplated the testing can be carried out upon a single part 10 or batches of parts. While the testing a single part 10 is able to identify whether the specific part is suspect counterfeit, the single testing requires the equipment and timing to individually test each part. Alternatively, the parts can be tested in batches. While the batch testing allows simultaneous testing, it is not able to identify which of the parts in the batch is suspect counterfeit.

In those configurations of the system, testing after connection of part 10 to a board, includes testing an electrically connected part and the board. Thus, the predetermined target analyte can be selected to produce an ion chromatogram 90 corresponding to one of the part 10, the board and the process of connecting.

It is further understood, the connecting of the part 10 and the board includes connecting a plurality of parts to the board and further exposing a subset of the plurality of parts to a second solvent 30.

That is, a first solvent 30 and a second solvent 30 can be used on a given part to produce corresponding chromatograms 90. Alternatively, a first solvent 30 can be used on a given part or portion of the assembly and a second solvent 30 used on a different part or different portion of the assembly to produce corresponding chromatograms 90.

The solvent 30 from the tested part 10 or assembly is then introduced, either manually or with an autosampler, into a sample loop of known volume. Typically, the mobile phase 44 carries the sample from the loop onto the column 52 that contains some form of the stationary phase material 50. In one configuration, the stationary phase material is a resin or gel matrix consisting of agarose or cellulose beads with covalently bonded charged functional groups.

The predetermined target analytes (anions or cations) are retained on the stationary phase 50. The retained predetermined target analytes can then be eluted by increasing the concentration of a similarly charged species that will displace the analyte ions from the stationary phase 50. The detector 60 then examines the eluent typically by conductivity or UV/Visible light absorbance to identify the analyte. However, it is understood that any detector 60 as known in the art can be used to detect the target analytes, including (i) destructive, charged aerosol detector, flame ionization detector, aerosol-based detector, flame photometric detector, atomic-emission detector, nitrogen phosphorus detector, evaporative light scattering detector, mass spectrometer, electrolytic conductivity detector, Mira detector and (ii) non-destructive detectors, such as UV detectors, either fixed or variable wavelength, thermal conductivity detector, (TCD), fluorescence detectors which irradiates the effluent with a light of set wavelength and measure the fluorescence of the effluent at a single or multiple wavelength, electron capture detector, (ECD), conductivity monitor, photoionization detector, (PID), refractive index detector (RI or RID), radio flow detector which measures radioactivity of the effluent, as well as chiral detector.

Figure 10:
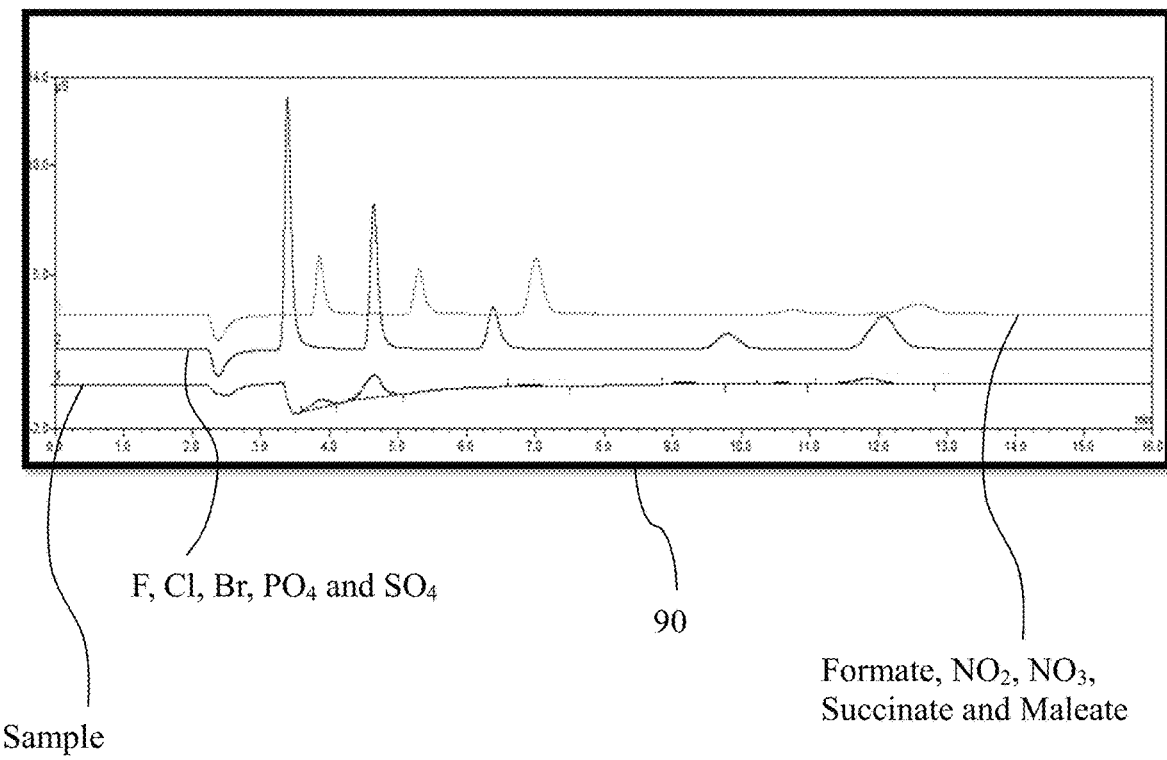
FIG. 10 is chromatogram showing predetermined analytes for a first tested part.
Figure 11:
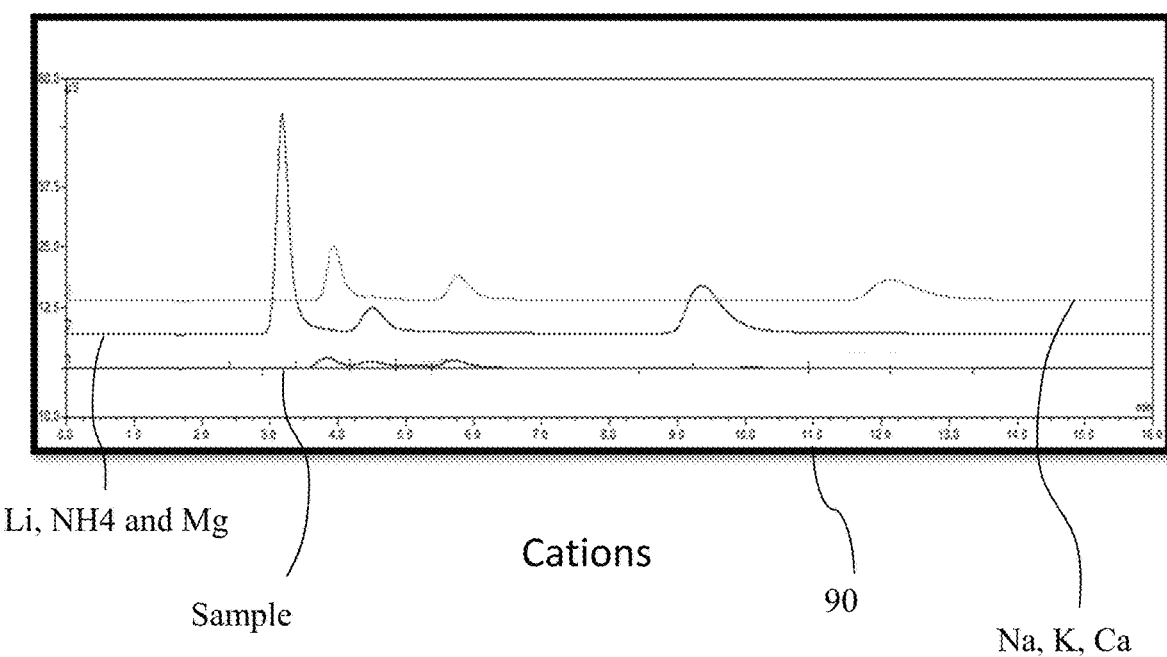
FIG. 11 is chromatogram showing predetermined analytes for a second tested part.

Referring to FIGS. 10-12, a chromatogram 90 is then generated corresponding to the detected analytes in the eluent.

A chromatogram 90 is known or generated for a known genuine part or conforming process, and in certain configurations a chromatogram for each of a plurality of known genuine parts or runs of the conforming process. Thus, the chromatogram 90 of at least one genuine part or conforming process is known.

The chromatogram 90 corresponding to the tested part (or process) is then compared to the chromatogram 90 of at least one genuine part (or conforming process). The comparison can be in tabular, numeric, symbolic, graphic or text form. In one configuration, the comparison is done automatically by programmed computer or the controller 80; wherein the values of the obtained chromatogram 90 are compared to the values of the chromatogram 90 of the known genuine part or conforming process that are stored in a storage device, such as the memory 70.

An output based on the comparison can include a first indicator, such as a red symbol, if the level of a specific analyte is below a threshold; a yellow symbol if the level of a specific analyte is at (such as within +/−5% or within +/−10% or within +/−20% or within) of the threshold or red if the level of a specific analyte is above the threshold. Thus, if 19 analytes are included in the chromatogram 90, the resulting comparison can have 19 green indicators—providing high confidence the part is genuine (or the process is conforming); or 19 red indicators—providing high confidence the part is counterfeit (or the process is non-conforming); or some combination of red and green, wherein depending on the part or process, there may be an associated go/no-go indicator or a corresponding confidence of genuine part (conforming process) or counterfeit part (non-conforming process). That is, depending on the intended use of the part 10 or result of the process, the go/no-go indicator threshold can be set to require each analyte be at a go threshold, or the go/no-go indicator threshold can be set to require at least a majority of the measured analytes be at a go threshold. It is understood, that any combination of individual thresholds to an overall go/no-go status can be employed.

Based on the comparison, the tested part 10 or parts are identified as suspect counterfeit, (or counterfeit, depending on the established comparison) or genuine. Alternatively, if the parts 10 are tested to identify the manufacturing process as conforming or non-conforming, the real time testing of the parts allows for immediate correction of the manufacturing process. Further, the comparison can result in a go/no-go status to the tested part or process. A go/no-go indicator can be any of a variety of indicators such as but not limited to a light of a given color, a label, an audible indicator or even a printing or marking applied directly to the part.

It is understood, at least the tested portion of the part 10 must be capable of nondestructive exposure to the solvent for a sufficient time for the solvent to acquire available measurable traces of the predetermined target analyte.

In terms of a system, the present disclosure includes the reservoir 20 for retaining a volume of the solvent 30, wherein the reservoir can be a fixed or variable volume in response to or corresponding to a volume of the part 10 or assembly being tested. A controller 80 such as a computer having or connected to the memory 70 retaining the database of chromatograms 90 corresponding to known genuine parts or previously tested parts or processes is used to compare at least one chromatogram 90 of the part 10 being tested to determine the status of the part.

The present disclosure provides for the identification of a suspect counterfeit part, whether prior or subsequent to assembly. Thus, incoming parts can be tested prior to incorporation into an assembly. It is contemplated the testing can be on representative parts 10, or all parts, depending on the intended uses and sources of the parts. Alternatively, or additionally, the testing can be conducted on assemblies or portions of assemblies, so as to permit a monitoring of the manufacturing process to identify manufacturing issues.

While ion chromatography is set forth as a representative example of the chromatography, it is understood other types of chromatography can be employed. The available chromatography includes dissolving an analyte in a fluid called the mobile phase 44, which carries the analyte through a structure holding another material called the stationary phase 50. The various constituents in the mobile phase 44 travel at different speeds, causing them to separate. The separation is based on differential partitioning between the mobile and stationary phases. The mobile phase 44 can be a solvent 30 as well as other liquids used to provide a different affinity to the target analytes. Thus, in addition to the ion chromatography, the chromatography includes but is not limited to liquid chromatography including adsorption chromatography and distribution chromatography.

Further, by testing the part by liquid chromatography, such as ion chromatography, a suspect counterfeit part can be detected without requiring the electrical testing currently used in the art, wherein leads are connected to the part and a test electrical signal is generated, passed through the part and monitored to determine if the part is suspect counterfeit.

Thus, in one configuration the present disclosure provides a method comprising (i) exposing a suspect part 10 to a solvent 30, the solvent configured to dissolve at least one predetermined target analyte; (ii) obtaining a first chromatogram 90 corresponding to the at least one predetermined analyte dissolved in the solvent exposed to the suspect part; and (iii) comparing the first chromatogram to a preexisting chromatogram 90 corresponding to at least one of a known good part and a conforming process. A representative method for generating an indicator is shown in FIG. 13. The method further contemplates adjusting a volume of the solvent corresponding to a volume of the suspect part, such that the volume of the part is at least 20%, or 40%, or 60%, or 80%, or 100% or 120%, or 140%, or 160% of the volume of the solvent.

A further method is provided including (i) connecting a part 10 and a board to form an assembly; (ii) contacting a solvent 30 with at least a portion of the assembly, the solvent configured to dissolve a predetermined target analyte and form a mixture; (iii) passing the mixture relative to a stationary phase; (iv) generating a first chromatogram 90 corresponding to the predetermined target analyte carried by the solvent contacting the assembly; and (v) associating an assessment value with the assembly, the assessment value corresponding to the first chromatogram. This method includes the additional steps wherein (i) the predetermined target analyte having sufficient target analytes to identify at least one of the part and the board as counterfeit; (ii) the predetermined target analyte includes sufficient target analytes to identify either of the part and the board as counterfeit; (iii) the predetermined target analyte includes at least three anions and three cations; (iv) the predetermined target analyte is selected to produce an ion chromatogram 90 corresponding to one of the part, the board and the connecting. The method also includes the additional steps of (i) connecting the part 10 and the board includes electrically connecting the part and the board; (ii) adjusting a volume of the solvent in response to a volume of the assembly; (iii) adjusting a volume of the solvent to be less than a volume of the assembly; (iv) adjusting a volume of the solvent to be equal to a volume of the assembly; (v) adjusting a volume of the solvent to be greater than a volume of the assembly and (vi) connecting a plurality of parts to the board and further comprising exposing a subset of the plurality of parts to a second solvent.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A method of assessing a suspect part, the method comprising:
   (a) adjusting a volume of a solvent to correspond to a volume of a suspect part such that the volume of the suspect part is at least 20% of the volume of the solvent;
   (b) forming a mixture by nondestructively exposing a portion of the suspect part to the solvent by contacting a sealing interface with a surface of the suspect part to form a reservoir volume partly defined by the portion of the suspect part and disposing a fixed volume of solvent in the reservoir volume to contact the portion of the suspect part partly defining the reservoir volume, the solvent configured to dissolve at least one predetermined target analyte in a predetermined residence time;
   (c) generating a first chromatogram, by ion chromatography, corresponding to the formed mixture; and
   (d) comparing the first chromatogram to a preexisting chromatogram to output an indicator, wherein the preexisting chromatogram is based on the at least one predetermined target analyte dissolved by the solvent, and wherein the preexisting chromatogram corresponds to a known genuine part and a conforming manufacturing process, the indicator corresponding to a level of the predetermined target analyte in the first chromatogram relative to a predetermined threshold of the predetermined target analyte in the preexisting chromatogram, wherein the indicator identifies whether the level of the predetermined target analyte in the first chromatogram is (i) below the predetermined threshold outside a set range, (ii) within the set range above or below the predetermined threshold, or (iii) above the predetermined threshold outside of the set range.

2. The method of claim 1, further comprising one of rejecting or accepting the suspect part based on the indicator.

3. The method of claim 1, wherein the at least one predetermined target analyte includes at least one target anion and one target cation.

4. The method of claim 1, wherein the at least one predetermined target analyte includes at least three target anions and three target cations.

5. The method of claim 1, further comprising adjusting a volume of the solvent corresponding to a volume of the suspect part.

6. The method of claim 1, further comprising determining a status of the suspect part as at least one of a genuine part and a counterfeit part based on the compared first chromatogram and the preexisting chromatogram.

7. The method of claim 1, wherein the solvent is an aqueous solution.

8. The method of claim 1, wherein the solvent is nondestructive to the suspect part.

9. The method of claim 1, wherein the sealing interface exposes only the portion of the part to the solvent.

10. A method for a manufacturing process, the method comprising:
    (a) adjusting a volume of a first solvent to correspond to a volume of a part such that the volume of the part is at least 20% of the volume of the solvent;
    (b) adjusting a volume of a different second solvent to correspond to the volume of the part such that the volume of the part is at least 20% of the volume of the different second solvent;

(c) connecting a part and a board to form an assembly;
(d) contacting the first solvent with a first portion of the assembly for a first predetermined residence time, the first solvent configured to dissolve a first predetermined target analyte;
(e) generating a first chromatogram corresponding to the first predetermined target analyte carried by the first solvent contacting the first portion of the assembly;
(f) contacting the different second solvent with a second portion of the assembly for a second predetermined residence time, the second solvent configured to dissolve a second predetermined target analyte;
(g) generating a second chromatogram corresponding to the second predetermined target analyte carried by the second solvent contacting the second portion of the assembly; and
(h) comparing the first chromatogram to a third chromatogram to output an indicator, wherein the third chromatogram corresponds to a conforming manufacturing process, wherein the third chromatogram is based on the first predetermined target analyte dissolved by the first solvent, the indicator corresponding to a level of the first predetermined target analyte in the first chromatogram relative to a predetermined threshold of the first predetermined target analyte in the third chromatogram, wherein the indicator identifies whether the level of the first predetermined target analyte in the first chromatogram is (i) below the predetermined threshold outside a set range, (ii) within the set range above or below the predetermined threshold, or (iii) above the predetermined threshold outside the set range.

11. The method of claim 10, wherein the first chromatogram provides an indicator of the manufacturing process being in compliance with a protocol.

12. The method of claim 10, wherein the first predetermined target analyte includes target analytes to identify the manufacturing process as conforming.

13. The method of claim 10, wherein the first predetermined target analyte includes target analytes to identify either of the part and the board as counterfeit.

14. The method of claim 10, wherein the first predetermined target analyte includes at least three anions and three cations.

15. The method of claim 10, wherein connecting the part and the board includes electrically connecting the part and the board.

16. The method of claim 10, wherein the first predetermined target analyte is selected to produce an ion chromatogram corresponding to one of the part, the board and the assembly.

17. The method of claim 10, further comprising adjusting a volume of the first solvent in response to a volume of the assembly.

18. The method of claim 10, wherein connecting the part and the board includes connecting a plurality of parts to the board and further comprising exposing a subset of the plurality of parts to the second solvent.

19. The method of claim 10, further comprising contacting a third solvent with the part prior to connecting to form at least a portion of the assembly, the third solvent configured to dissolve a third predetermined target analyte.

20. The method of claim 10, wherein the first solvent is nondestructive to the first portion of the assembly.

* * * * *